United States Patent [19]
Collins et al.
[11] Patent Number: 4,870,360
[45] Date of Patent: Sep. 26, 1989

[54] APPARATUS FOR IDENTIFYING AN ELECTRICALLY CONDUCTING MATERIAL

[75] Inventors: Alan J. Collins, Risca; Mazen R. Husni, Llanedeyrn, both of United Kingdom

[73] Assignee: University College Cardiff Consulatants Limited, United Kingdom

[21] Appl. No.: 731,595

[22] Filed: May 6, 1985

Related U.S. Application Data

[63] Continuation of Ser. No. 428,301, Sep. 29, 1982, abandoned.

[30] Foreign Application Priority Data

Oct. 2, 1981 [GB] United Kingdom ................. 8129871

[51] Int. Cl.[4] ...................... G01N 27/72; G01R 33/12; G07F 3/02

[52] U.S. Cl. .................................... 324/235; 324/251; 324/252; 324/207; 194/317; 194/318

[58] Field of Search ................ 324/202, 207, 227-230, 324/232, 233, 234-243; 194/106 A, 317, 318

[56] References Cited

U.S. PATENT DOCUMENTS

| | | | |
|---|---|---|---|
| 2,987,669 | 6/1961 | Kallmann | 324/251 |
| 3,373,856 | 3/1968 | Kusters et al. | 194/318 |
| 3,449,664 | 6/1969 | Smith | 324/235 |
| 3,450,986 | 6/1969 | Chapman et al. | 324/235 |
| 3,498,437 | 3/1970 | Ukon et al. | 194/317 |
| 3,599,771 | 8/1971 | Hinterstocker | 194/100 A |
| 3,738,469 | 6/1973 | Prümm | 194/318 |
| 3,749,220 | 7/1973 | Tabiichi et al. | 194/100 A |
| 3,869,663 | 3/1975 | Tschierse | 324/239 X |
| 3,901,367 | 8/1975 | Miyazawa | 194/317 |
| 3,933,232 | 1/1976 | Searle et al. | 194/318 |
| 3,956,692 | 5/1976 | Weinberg | 324/236 X |
| 3,977,508 | 8/1976 | Baumberger . | |
| 4,066,962 | 1/1978 | Jaffe | 324/235 X |
| 4,086,527 | 4/1978 | Cadot | 324/233 |
| 4,119,911 | 10/1978 | Johnson, Jr. | 324/208 |
| 4,190,799 | 2/1980 | Miller et al. | 324/228 X |
| 4,257,435 | 3/1981 | Tanaka et al. | 194/317 X |
| 4,364,011 | 12/1982 | Bloomfield et al. | 324/165 X |
| 4,469,213 | 9/1984 | Nicholson et al. | 194/100 A |
| 4,572,349 | 2/1986 | Furuya et al. | 194/318 |

FOREIGN PATENT DOCUMENTS

| | | | |
|---|---|---|---|
| 2350989 | 4/1974 | Fed. Rep. of Germany | 194/100 A |
| 0024592 | 2/1977 | Japan | 324/234 |
| 0024593 | 2/1977 | Japan | 324/234 |
| 0238855 | 3/1969 | U.S.S.R. | 324/234 |

*Primary Examiner*—Reinhard J. Eisenzopf
*Assistant Examiner*—W. Edmonds
*Attorney, Agent, or Firm*—Wood, Dalton, Phillips Mason & Rowe

[57] ABSTRACT

When an electrically conducting material is subjected to an alternating magnetic field local changes in the magnetic field adjacent to the conducting material are detected by a detector comprising a magnetoresistor or Hall crystal which generate an electrical signal when subjected to the magnetic field.

The process and apparatus can be used to identify, classify and locate electrically conductive material.

The detectors can be of the order of a few millimeters in size and so can be used to detect local changes in the magnetic field over correspondingly small areas of the material.

The invention is particularly useful in identifying coins used in coin operated machines.

13 Claims, 4 Drawing Sheets

APPARATUS FOR IDENTIFYING AN ELECTRICALLY CONDUCTING MATERIAL

This application is a continuation, of application Ser. No. 428,301, filed Sept. 29, 1982, now abandoned.

This invention relates to a process and apparatus particularly suitable for detecting, identifying, classifying and locating electrically conducting material. The process and apparatus are particularly suitable for identifying coins.

Since the advent of coin-operated mechanisms many different detector systems have been employed for discriminating between the materials and/or sizes of coins. Inductance techniques have been used for this purpose, such techniques being based on the change in inductance of a coil when a coin is introduced into close proximity. However, such systems detect only the overall effect of the coin as a whole on the flux linkage.

The present invention makes use of other detectors which, when an alternating magnetic field is applied to electrically conducting material, can detect local changes in the magnetic field over selected areas of the electrically conducting materials. The term 'alternating' includes any periodic change about a base line without necessarily involving a change in polarity.

The magnetoresistive effect in thin films of certain ferromagnetic materials arises from an anisotropic contribution $\Delta\rho$, to the total resistivity $\rho$. Hunt has analysed this effect (Transactions of Institute of Electrical and Electronic Engineer, Mag. 7 (1971) pp 150–4) and has shown that the change in resistivity of an element of a film or thin sheet of the material, and hence the change in terminal voltage if a constant current is passed along the element, is a function of a magnetic field applied to the element in the plane of the film. Consequently the detector can be thin and so very selective.

When a Hall crystal is used to detect the local magnetic field applied to it, the field gives rise to an output voltage from the crystal. They can be used to produce detectors which are substantially rectangular or square.

Both types of detectors can be made small with the advantage described later.

According to this invention, magnetoristor or Hall crystal detectors are supplied to the detection of local changes in an alternating magnetic field which arise when an electrically conducting material is placed in the field, the resulting change in the electrical characteristics of the detector being used for example to identify, classify or locate the conducting material.

The invention also provides apparatus for identifying, classifying or locating an electrically conducting material comprising means for applying an alternating magnetic field to the material and a magnetoresistor or Hall crystal detector arranged to detect local changes in the magnetic field resulting from the presence therein of the material.

The invention relies on the fact that when an electrically conducting material is placed in a changing applied magnetic field, eddy currents are induced in the material which currents modify the local field in close proximity to the material. The nature of the modification over any particular area of the material will depend on such factors as the nature of the material and its dimension and may vary from area to area.

We have found that in the case of a coin the local modification of the applied field varies from a point just outside one end of the coin to a point just outside the opposite edge of the coin and that, for example, a profile of these variations across a diameter of the coin can be prepared from a multiplicity of measurements across the coin using a detector comprising a magnetoresistor or Hall crystal.

These modifications in the field can be detected using thin film magnetoresistors, the resistance of which changes when a magnetic field is applied thereto. The change in resistance resulting from a change in the applied magnetic field can be detected and in known manner can be used, to identify, and optionally reject or accept, to classify or to locate the electrically conductive material present in the field. Usually, a constant current is passed through the magnetoresistor and the different resistance due to the different characteristics of that part of the field in which it is located is evidenced by a different voltage over the terminals of the resistor.

Similarly, when a Hall crystal is used as the detector, a difference in the magnetic field in the vicinity of the material give rise to a difference in the output voltage of the crystal.

The electrical signal thus produced by a magnetoresistor or a Hall crystal can readily be compared with a standard or a reference value and any differences or similarities between them can readily be determined by conventional means and the resulting determination can be used for identification, classification or location of the electrically conducting material.

The change in the magnetic field in the vicinity of the material resulting from the induced eddy currents in the electrically conducting material is both in amplitude and in phase relative to the applied field or to a reference field and the above-mentioned detectors may be used to detect one or the other of these parameters and produce an appropriate signal.

When measuring changes in amplitude of the local magnetic field comparison may be made with a standard detector of the same type positioned within the applied magnetic field but outside the locality in which the change in magnetic field occurs. The voltage across the detector in the locality of the changed field is compared with the voltage across the standard detector and the change in voltage provides a measure of the local change in amplitude of the magnetic field.

When measuring changes in phase of the local magnetic field the phase standard for comparison can be taken from the drive to the applied magnetic field or a reference field. This embodiment of the invention has the advantage that problems of drift, which may be present in amplitude detection systems, can be much reduced or even eliminated.

In another embodiment of the invention which is particularly suitable for identifying coins, the changed field resulting from placing a test sample of the material in it is compared with a reference field as changed by a standard sample of the material. When the material is a coin a null difference between the fields when compared at one or more corresponding points on the two coins, indicates that they are of the same type. On the other hand, a significant difference at one or more pairs of corresponding points indicates that the coins are dissimilar. Measurements at several different pairs of points across the two coins makes the comparison much more sensitive and reliable.

Advantages of this embodiment using standard samples are:

1. the applied magnetic field need not be so accurately controlled since changes in the field would affect both coins.

2. a memory unit which otherwise may be needed to provide standard reference values for comparison will not be required.

3. simpler electronic circuitry may be used.

4. the detection unit may be less sensitive to the effects of external magnetic field or variations in voltage supply.

5. reprogramming of the process or apparatus for a different standard or set of standards, is simply effected by changing the standard sample or samples.

In multiple coin detector units for example, sample coins for the acceptable types may be located in a sample block and an inserted coin may be compared sequentially with each standard sample coin in the block until a compatible coin is encountered. In the event that no compatible coin is encountered the inserted coin is rejected.

The applied magnetic field is preferably a regularly alternating magnetic field and the most suitable frequency of such an alternative magnetic field applied to the electrically conducting material depends to some extent on the nature of the material. For example, when this invention is used in identification, followed by acceptance or rejection, of coins a frequency of 2 to 6 $kH_z$, or preferably 3 to 5 $kH_z$, is particularly suitable for cupronickel coins. When applied to bronze coins, a frequency of 0.5 to 2 $kH_z$, or preferably of 0.75 to 1.5 $kH_z$, is particularly suitable.

In identifying coins a first frequency, say about 2 $kH_z$, may be applied in order to identify the alloy of the coin, a further frequency or frequencies most suitable for that alloy then being applied to further identify the coin, e.g. by dimensions.

An advantage arising from the detectors used in the present invention is that they can be made very small, for example, from 5 mm to 1 mm in length and/or width, and in consequence can detect changes in magnetic fields over equivalently small areas. They can therefore be used to survey in much finer detail than say when using a larger conventional induction coil. They are particularly useful in locating an edge of the conducting material since there is a marked change in the local magnetic field at this point and because of the small thickness of the detector, say 400 Å the edge can be located with a high degree of accuracy, possibly to as little at $\pm 0.5$ micro m. In this way, for example, the diameter of a coin may be identified, or the edge of a running strip of metal located.

Instead of a single detector, an array of detectors may be used in conjunction with an electronic multiplexing system to provide a simultaneous detailed survey of changes in local magnetic field. The array may be linear to provide a simultaneous survey say across a whole diameter of a coin, or the multiplicity of detectors may be so spaced as to be capable of surveying an area simultaneously.

The detector output is a function of, inter alia:

1. The frequency and form of the applied field.

2. The amplitude and orientation of the applied field.

3. The dimensions of the conducting material.

4. The conductivity/resistivity permeability of the material.

5. The shape of the material.

6. The surface profile of the material

7. The presence or absence, in the vicinity of the detector, of a conducting material.

8. The orientation and position of the detector relative to the conducting material and applied field.

9. The material, dimensions and current density employed in the detector.

In the accompanying drawings the use of a magnetoresistive detector is illustrated by way of example in FIGS. 1–3 of the accompanying drawings in which.

Figure 4:
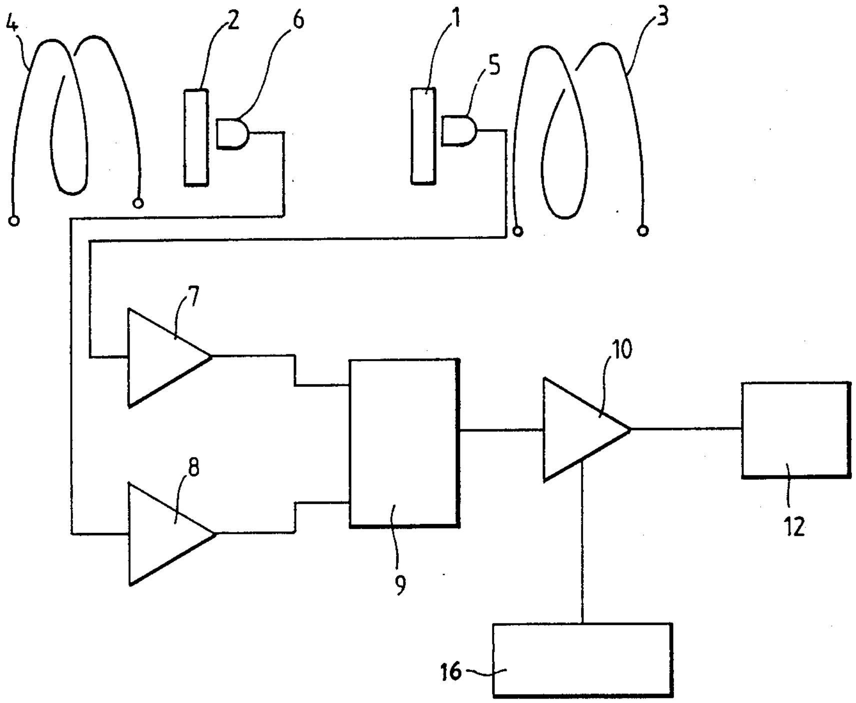

The use of a standard sample for comparison is illustrated by way of example in FIG. 4.

Figure 1:
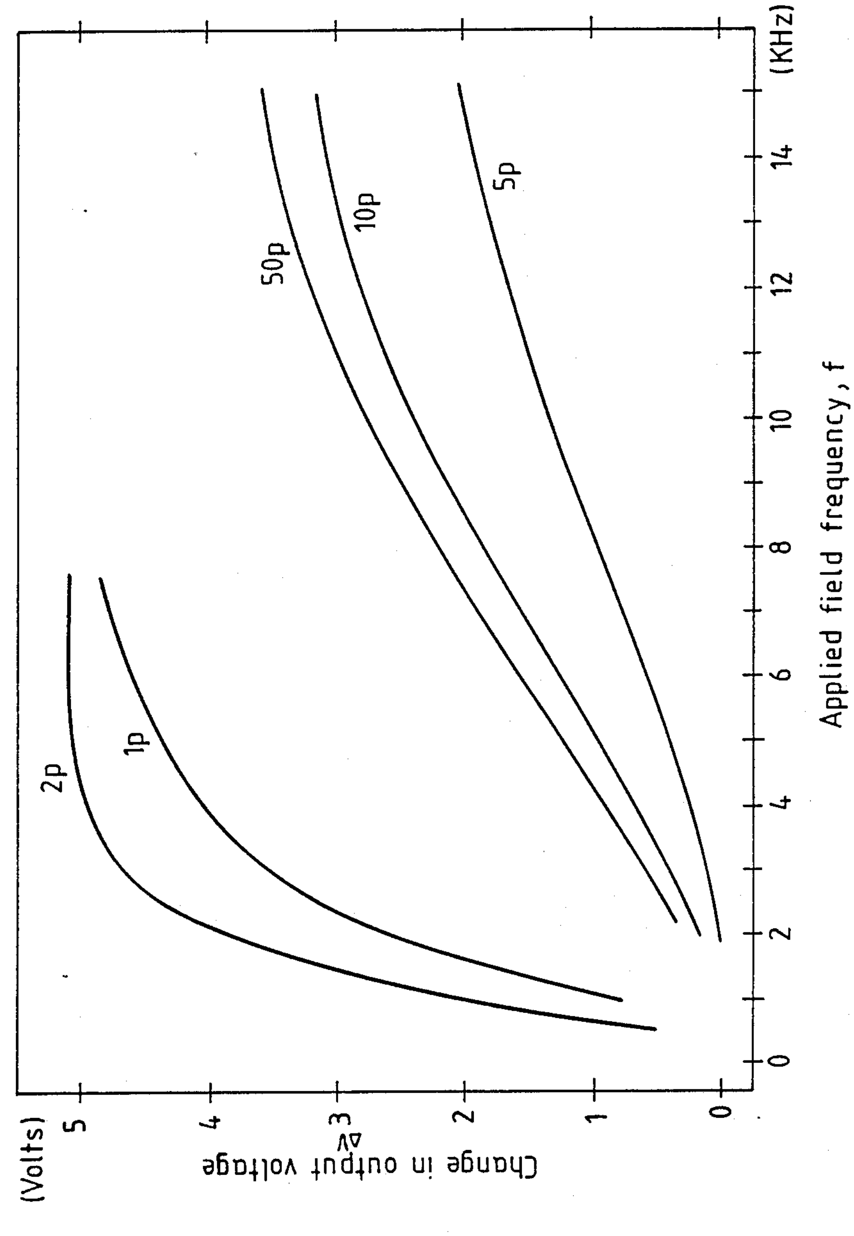
FIG. 1 shows the changes in amplified (×1000) output voltage of an unbiased magnetoresistor detector when placed in a uniform alternating applied field, in close proximity to the centre of various coins.
Figure 2:
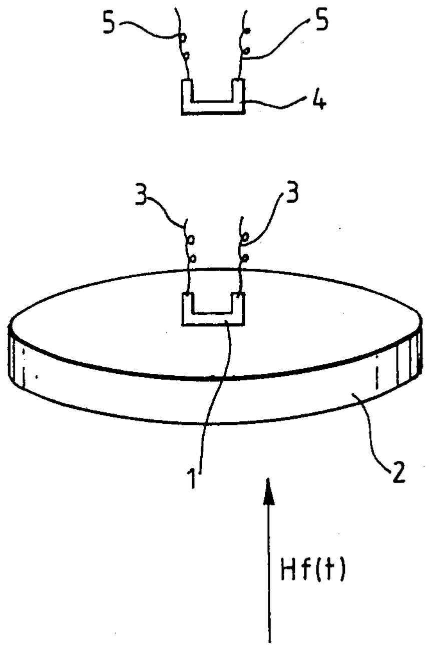
FIG. 2 shows the experimental arrangement employed to obtain the results shown in FIG. 1

An example of the changes in output of a magnetoresistor detectors, when placed in an alternating magnetic field in close proximity to a coin, is shown in FIG. 1. The figure shows the relative change in output (compared to the case with no coin present) as a function of frequency for various coins. These results were obtained with the detector perpendicular to the coin, and in intimate contact with the centre of the coin. The applied field was a uniform sinusoidal field applied perpendicularly to the coin. The experimental arrangement is shown in FIG. 2. in which a thin-film magnetoresistor detector 1 is positioned adjacent the centre of a coin 2 which is subjected to an alternating magnetic field H. The detector is 2 mm long, 300 Å thick and 50 mm high. Through leads 3 a constant current is passed through the detector, the leads also being used in measuring the change in voltage across the detector. The change in voltage is then compared against a standard provided by a similar magnetoresistor 4 with leads 5 which is located within the uniform applied field but outside the locality affected by eddy currents in the coin 2. In this case the standard resistor was 10 mm away from the detector. The signals from the two magnetoresistors are amplified and filtered and then fed into a differential amplifier, the output from which is proportional to the local change in field due to eddy current. The results show that by employing one or more applied field frequencies it is possible to discriminate between coins.

Figure 3:
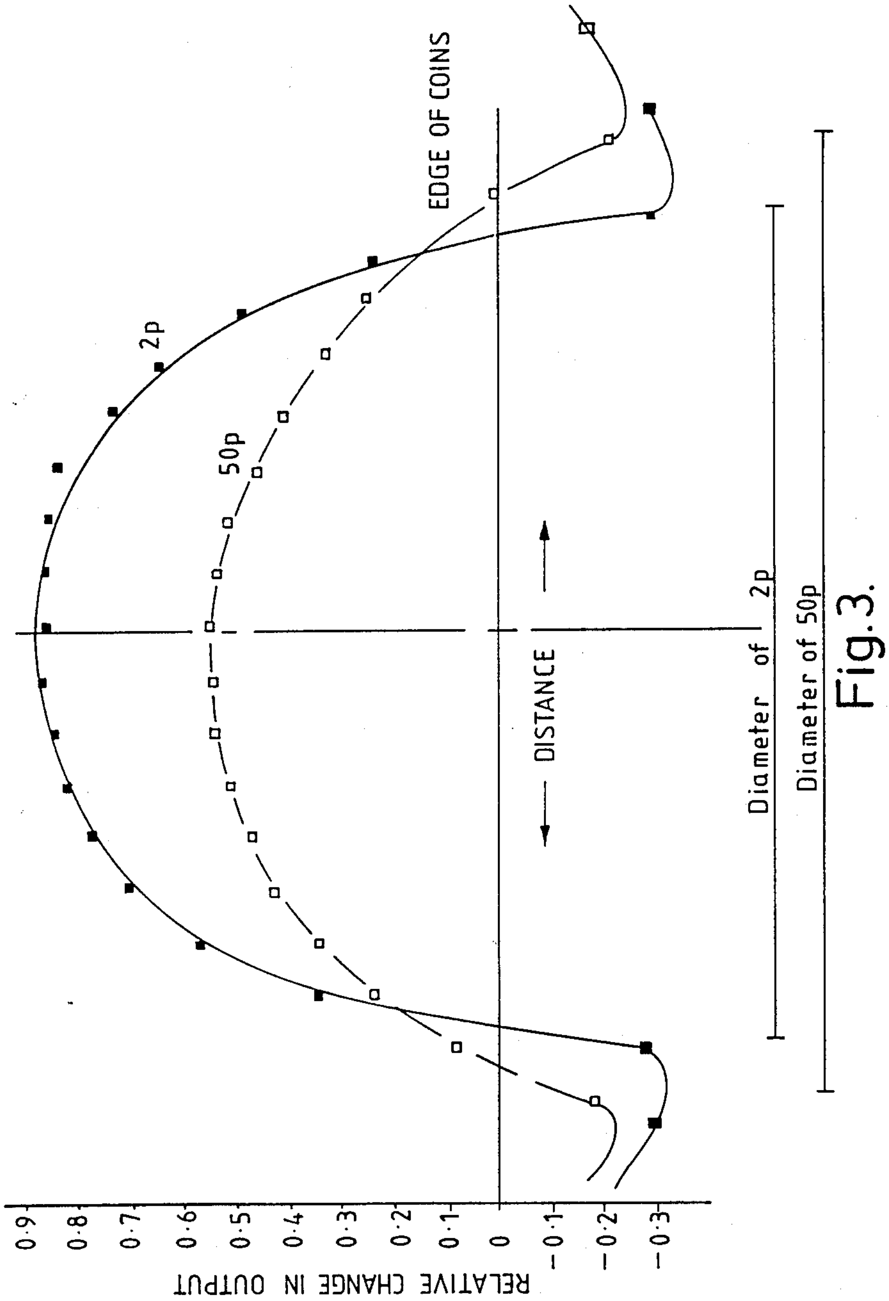
FIG. 3 shows the relative changes in output of a magnetoresistor detector as it is traversed across the diameter of two different coins.

FIG. 3 shows the relative change in output of the detector as a function of the position of the detector on a line drawn through the diameter of two different coins. The results show that a single detector (as employed in this case) or an array of detectors can be employed to discriminate between coins of different alloys, diameter and/or shape, i.e. by monitoring the output of detector(s) when placed at different points on the coin. In FIG. 3, the sharp upturn at the ends of the curves indicates the edge of the coin and it will be noted that these coincide quite closely with the ends of the indicated actual diameters of the coins.

These parameters of constitution, size and shape can be determined with the coin stationary in or moving through the applied magnetic field.

Similar results are obtained when the detector used is a Hall crystal.

In the application of the process and apparatus of this invention to coin identification, the detectors may thus be employed to discriminate between coins of different materials and size. Further, some difference in surface profiles can be employed to discriminate between different coins. By storing this information by way of reference values for example in a microprocessor system, it is possible to provide a secure coin identification system based on either a single detector or an array of detectors. The system can be employed to discriminate between coins of a particular country and/or between coinage from different countries. The system can be made compatible with microprocessor-based vending machines including those dispensing change. All signals are electrical in nature at source. Since the identification can be carried out statically or dynamically, i.e. with the coin stationary or moving, the present invention can readily be applied to coin operated machines.

An application of this invention using standard samples is illustrated in FIG. 4 in which a test coin 6 and a standard sample coin 7 are located in an alternating magnetic field generated by coils 8 and 9 driven by identical drives. Magnetoresistor detectors 10 and 11 are provided adjacent each coin with facilities (not shown) for positioning the detectors synchronously at predetermined points on the coins. The signals generated by the resistors i.e. the voltage across the detectors when a constant current is passed through them, are amplified in amplifiers 12 and 13 and any phase difference between the signals is compared in phase difference circuit 14. The output is passed through a digital filter 15 which eliminates false pulses due to noise, the filter being adjusted by a tolerance control 16. The filtered output is then used to operate an accept/reject control 17. If the phase difference is significant the test coin is rejected.

In another embodiment where a lower degree of discrimination may be acceptable the detector 11 is fixed in relation to the standard sample coin 7, say at the centre of the coin. Detector 10 is located in a slide which conveys the test coin 6 and a reading of its output signal is taken at the moment when its position in relation to the test coin 6 is the same as that of detector 11 in relation to coin 7. Again, if there is a null or acceptable difference between the signals from the two detectors, the test coin is accepted. If there is a significant difference it is rejected.

The process and apparatus of this invention can be applied to electrically conducting material where size, for example thickness, is to be classified. Such size classification can be applied to monitoring the size of material being produced.

Table 1 shows the results of measuring at the centre of copper discs of 2.6 mm diameter, the phase change of an alternating sinusoidal magnetic field of 2 $kH_z$ frequency applied perpendicularly to the discs. A Hall crystal detector approximately 2.5 mm square placed in the centre of the discs was used to detect the change in phase with reference to the drive to the applied magnetic field.

TABLE 1

| Thickness of discs - mm | 0.65 | 0.8 | 1.35 | 2 |
|---|---|---|---|---|
| Phase change - degree | 50 | 57 | 75 | 72 |

The change in phase with any particular thickness varies with the frequency of the applied field. The most suitable frequency to use will therefore depend on the range of thicknesses to be measured and also on the other dimensions of the electrically conducting material to be checked, and on the nature of the material. The optimum frequency in any particular circumstances can readily be established by preliminary tests. The output from a detector of this invention used to detect change in thickness can be applied for example to control the thickness of metal strip or sheet produced by a rolling mill.

The magnitude of the eddy currents generated in conductive material subjected to the alternating magnetic field, and consequently the local changes in the magnetic field, depends on the nature of the material and in another application of this invention the process and apparatus is used to identify different metals.

Table 2 shows the results of measuring, by means of a magnetoresistor detector, the change in phase of an alternating magnetic field of 1 $kH_z$ frequency at the centre of discs of the same size but of different metals to which the alternating field was applied, the phase change being with reference to the drive of the magnetic field. The discs were 2.6 mm diameter and 2 mm thick.

TABLE 2

| Metal | Steel | Brass | Aluminim | Copper |
|---|---|---|---|---|
| Phase change - degree | 6 | 27 | 45 | 67 |

The process and apparatus of this invention may also be used to locate the position of metals, particularly the edges of metal sheet, and another application is in guiding metal strip through, for example, a rolling mill. In this application, the detector is located over an edge of the strip, preferably one detector over each opposed edge of the strip. The signal from the detectors may be compared with a standard reference value or with the signal from a standard detector positioned over the centre of the strip. A sideways drift of the metal strip produces an imbalance between the signals which is used to control the direction of the strip to centre it again.

Further, because of the possibility of detecting the change in magnetic field at a discontinuity in a conductor, the process and apparatus of this invention may be used to classify electrically conducting material by detecting cracks, flaws or discontinuities in it. In this case, the surface of the material is scanned by a magnetic field generator and two detectors spaced apart. The spaced detectors normally produce identical signals which when compared produce a null result. When one detector encounters a crack or flaw an imbalance of the signal occurs and is used to operate a warning indicator.

We claim:

1. In a process of identifying a coin by subjecting the coin to a magnetic field and using the change in the magnetic field resulting from the presence of the coin therein to identify the coin, the improvement comprising:

applying an alternating magnetic field to the coin under test;

detecting local change in the magnetic field adjacent each of a multiplicity of selected areas of the coin including areas adjacent the edge of the coin by positioning in the magnetic field over the selected area a detector capable of detecting such local changes and generating an electrical signal in response to the local changed magnetic field to which it is subjected, the resulting multiplicity of signal values providing a profile of local change sin the magnetic field from a point jut outside one edge of the coin to a point just outside the opposite edge of the coin; and making a comparison using a plurality of signal values from the profile and a corresponding plurality of signal values from a reference profile of a standard sample coin to develop an output which is used to identify the similarity between the coin under the test and the standard sample coin.

2. A process as claimed in claim 1 in which said reference profile is stored in a memory unit.

3. A process as claimed in claim 1 in which detector comprises a magnetoresistor.

4. A process as claimed in claim 1 in which the detector comprises a Hall crystal.

5. A process as claimed in claim 1 in which the signal generated from the coin under test is compared with a signal generated from a detector positioned over a standard coin of identified material.

6. An apparatus for identifying a coin comprising:

means for generating an alternating magnetic field in space occupied by the coin;

test detector means capable of detecting local changes in the magnetic field from a point just outside one edge of the coin to a point just outside the opposite edge of the coin and for generating a signal in response to the changed magnetic field;

means for locating the test detector means adjacent each of a multiplicity of selected areas of the coin when subjected to the alternating magnetic field;

means for generating corresponding reference signal values based on a standard coin; and means for comparing a plurality of the electrical signal values generated by the test detector means in response to the local magnetic fields to which it is subjected with a plurality of the corresponding reference signal values.

7. Apparatus as claimed in claim 6 further comprising a memory unit for storing said reference values for the purpose of comparison.

8. Apparatus as claimed in claim 6 comprising means for conveying the coin into and out of the alternating magnetic field.

9. Apparatus as claimed in claim 6 wherein the test detector means comprises means for consecutively positioning a test detector over a multiplicity of selected areas of a coin.

10. An apparatus as claimed in claim 6 wherein the test detector means comprises a plurality of detectors.

11. Apparatus as claimed in claim 6 in which the test detector comprises a magnetoresistor.

12. Apparatus as claimed in claim 6 in which the test detector comprises a Hall crystal.

13. An apparatus as claimed in claim 6 further comprising a standard detector for detecting changes in magnetic field, means for locating a standard sample of the material in the alternating magnetic field and for positioning the standard detector over the standard coin, and means for comparing electrical signal values generated by the test detector and the standard detector.

* * * * *